(12) United States Patent
Aleksov et al.

(10) Patent No.: US 11,532,574 B2
(45) Date of Patent: Dec. 20, 2022

(54) THROUGH-SUBSTRATE WAVEGUIDE (71) Applicant: Intel Corporation, Santa Clara, CA (US)

(72) Inventors: Aleksandar Aleksov, Chandler, AZ (US); Georgios Dogiamis, Chandler, AZ (US); Telesphor Kamgaing, Chandler, AZ (US); Gilbert W. Dewey, Beaverton, OR (US); Hyung-Jin Lee, Portland, OR (US)

(73) Assignee: Intel Coropration, Santa Clara, CA (US)

( * ) Notice: Subject to any disclaimer, the term of this patent is extended or adjusted under 35 U.S.C. 154(b) by 686 days.

(21) Appl. No.: 16/394,905

(22) Filed: Apr. 25, 2019

(65) Prior Publication Data
US 2020/0294939 A1  Sep. 17, 2020

(30) Foreign Application Priority Data
Mar. 12, 2019 (GR) .............................. 20190100117

(51) Int. Cl.
*H01L 21/00* (2006.01)
*H01L 23/66* (2006.01)
*H01L 23/13* (2006.01)
*H01L 23/498* (2006.01)
*H01L 23/00* (2006.01)
(Continued)

(52) U.S. Cl.
CPC .......... *H01L 23/66* (2013.01); *H01L 21/4846* (2013.01); *H01L 23/13* (2013.01); *H01L 23/49838* (2013.01); *H01L 24/16* (2013.01); *H01L 24/81* (2013.01); *H01L 2223/6627* (2013.01); *H01L 2223/6683* (2013.01); *H01L 2224/16155* (2013.01); *H01L 2924/1423* (2013.01); *H01L 2924/1903* (2013.01);
(Continued)

(58) Field of Classification Search
CPC ..... H01L 23/66; H01L 21/4846; H01L 23/13; H01L 2223/6622
See application file for complete search history.

(56) References Cited

U.S. PATENT DOCUMENTS 5,604,835 A * 2/1997 Nakamura ......... G02B 6/12004
385/132
5,764,832 A * 6/1998 Tabuchi ................. G02B 6/138
385/83
(Continued)

FOREIGN PATENT DOCUMENTS

CN  110168720 A  *  8/2019  .......... H01L 23/522
CN  112615120 A  *  4/2021
(Continued)

*Primary Examiner* — Laura M Menz
(74) *Attorney, Agent, or Firm* — Akona IP PC (57) ABSTRACT

Embodiments may relate to a semiconductor package that includes a die and a package substrate. The package substrate may include one or more cavities that go through the package substrate from a first side of the package substrate that faces the die to a second side of the package substrate opposite the first side. The semiconductor package may further include a waveguide communicatively coupled with the die. The waveguide may extend through one of the one or more cavities such that the waveguide protrudes from the second side of the package substrate. Other embodiments may be described or claimed.

20 Claims, 9 Drawing Sheets

(51) Int. Cl.
*H01L 21/48* (2006.01)
*H01P 3/16* (2006.01)
*H01P 3/06* (2006.01)
*H01P 11/00* (2006.01)

(52) U.S. Cl.
CPC .................. *H01P 3/06* (2013.01); *H01P 3/16* (2013.01); *H01P 11/005* (2013.01); *H01P 11/006* (2013.01)

(56) References Cited

U.S. PATENT DOCUMENTS

| | | | | |
|---|---|---|---|---|
| 6,650,823 | B1 * | 11/2003 | Murali | G02B 6/43 |
| | | | | 438/26 |
| 6,736,552 | B2 * | 5/2004 | Martwick | G02B 6/42 |
| | | | | 385/88 |
| 6,819,836 | B2 * | 11/2004 | Murali | G02B 6/42 |
| | | | | 385/47 |
| 6,869,882 | B2 * | 3/2005 | Murali | G02B 6/4248 |
| | | | | 257/E21.511 |
| 7,000,434 | B2 * | 2/2006 | Murali | G02B 6/42 |
| | | | | 65/413 |
| 11,037,892 | B2 * | 6/2021 | Nair | H01L 23/5383 |
| 11,211,345 | B2 * | 12/2021 | Aleksov | H01L 25/0652 |
| 11,251,171 | B2 * | 2/2022 | Rifani | G02B 6/4214 |
| 2012/0051695 | A1 * | 3/2012 | Harada | H01L 25/0657 |
| | | | | 385/39 |
| 2012/0061795 | A1 * | 3/2012 | Yen | H01L 21/76898 |
| | | | | 257/E21.334 |
| 2013/0264676 | A1 * | 10/2013 | Yang | H01L 21/76898 |
| | | | | 257/774 |
| 2014/0008817 | A1 * | 1/2014 | Horng | H01L 23/481 |
| | | | | 257/774 |
| 2019/0089036 | A1 * | 3/2019 | Kamgaing | H01P 5/087 |
| 2019/0319328 | A1 * | 10/2019 | Dogiamis | H01P 3/16 |
| 2020/0006142 | A1 * | 1/2020 | Hiblot | H01L 27/0924 |
| 2020/0112075 | A1 * | 4/2020 | Myers | H05K 1/0233 |
| 2020/0118951 | A1 * | 4/2020 | Aleksov | H01L 21/4857 |
| 2020/0280121 | A1 * | 9/2020 | Dogiamis | H01P 5/087 |
| 2020/0294939 | A1 * | 9/2020 | Aleksov | H01L 23/66 |
| 2020/0294940 | A1 * | 9/2020 | Dogiamis | H01P 3/122 |
| 2020/0296823 | A1 * | 9/2020 | Kamgaing | H05K 1/0243 |
| 2020/0303327 | A1 * | 9/2020 | Elsherbini | H01L 25/50 |
| 2020/0315052 | A1 * | 10/2020 | Kamgaing | H05K 1/0243 |
| 2022/0084965 | A1 * | 3/2022 | Aleksov | H01L 23/66 |

FOREIGN PATENT DOCUMENTS

| | | | | |
|---|---|---|---|---|
| DE | 112016007577 | T5 * | 10/2019 | ........... H01L 23/522 |
| DE | 102019132036 | A1 * | 5/2020 | ............. H01L 23/66 |
| DE | 102020103519 | A1 * | 9/2020 | ............. H01L 23/66 |
| EP | 3712938 | A1 * | 9/2020 | .......... H01L 23/5385 |
| EP | 3712939 | A1 * | 9/2020 | ............. H01L 23/66 |
| WO | WO-2018125150 | A1 * | 7/2018 | ........... H01L 23/481 |
| WO | WO-2018125183 | A1 * | 7/2018 | ........... H01L 23/522 |
| WO | WO-2018236336 | A1 * | 12/2018 | ......... H01L 21/4857 |

* cited by examiner

Coupling a die to a first side of a package substrate, wherein the package substrate has a cavity between the first side of the package substrate and a second side of the package substrate opposite the first side
805

Positioning a waveguide within a cavity of the package substrate such that the waveguide is communicatively coupled with the die and protrudes from the second side of the package substrate
810

THROUGH-SUBSTRATE WAVEGUIDE

CROSS-REFERENCE TO RELATED APPLICATION

This application claims the benefit of Greek Patent Application Serial No. 20190100117, filed Mar. 12, 2019, entitled "THROUGH-SUBSTRATE WAVEGUIDE," the entire contents of which are hereby incorporated by reference.

BACKGROUND

Legacy waveguide links involving high-frequency waveguides may use a plurality of connectors and intermediate signal paths to interconnect two dies or a die and another component in a computer environment. However, elements in the signal path may introduce some amount of signal degradation (i.e., in terms of additional signal loss or dispersion) which may require higher output power transmitter or more efficient dispersion compensation techniques. Increased attenuation may also require use of heavier equalization techniques or even forward error correction (FEC) coding, which may introduce additional latency.

DETAILED DESCRIPTION

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Embodiments herein relate to direct connectivity of individual waveguides, or waveguide bundles, to silicon dies for high-speed links between individual components of a computational system. As used herein, "high-speed" links may refer to links that allow electromagnetic signals with a frequency greater than about 20 gigahertz (GHz) to propagate through the link. The electromagnetic signals may be, for example, millimeter wave (mmWave) signals with a frequency between approximately 20 GHz and approximately 300 GHz. In other embodiments, the electromagnetic signals may have a higher frequency such as a frequency on the order of 1 terahertz (THz) or higher.

The components interconnected by the waveguides may be two dies sharing a same package, two dies on different packages, a die communicatively coupled with a package, a die communicatively coupled with a board, etc. The direct connectivity of the waveguide to the die or dies may help reduce, minimize, or eliminate losses that may exist due to on-package or on-board connectors and other interconnects that are in the path of the high-frequency/high-speed signal.

More generally, embodiments herein may allow for a simple, precise, and relatively low-cost way to directly align and connect waveguides to radiating elements on a die with minimal disruptions in the signal path between one die/component and another die/component. Embodiments may allow for excellent and simple waveguide alignment and minimal disruption to die and package technology and architecture.

Figure 1:
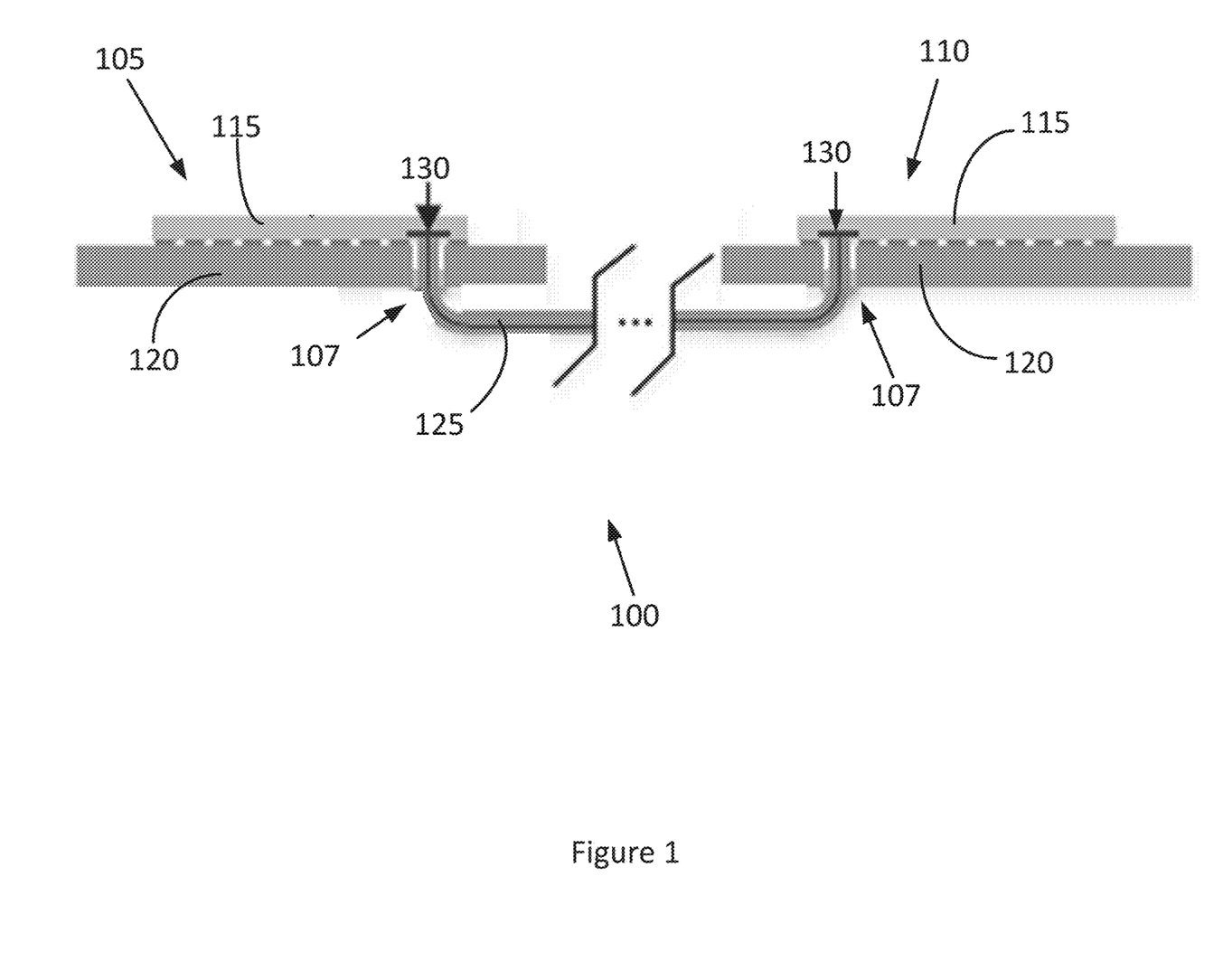
FIG. 1 illustrates a simplified view of an example system that includes two components and a waveguide therebetween, in accordance with various embodiments.

FIG. 1 illustrates a simplified view of an example system 100 that includes two components and a waveguide therebetween, in accordance with various embodiments. Specifically, FIG. 1 depicts an example system 100 with a semiconductor package 105 communicatively coupled with another semiconductor package 110. The semiconductor package 105 may include a die 115 coupled with a package substrate 120. Similarly, the semiconductor package 110 may include a die 115 coupled with a package substrate 120.

The dies 115 may be, for example, a component such as a processor, a memory, a core of a multi-core processor, etc. Additionally or alternatively, the dies 115 may be an element of, or related to, radio frequency (RF) circuitry that is designed to transmit, receive, facilitate transmission of, facilitate reception of, or otherwise process, generate, or alter one or more RF signals from a radiative antenna. Such signals may be, for example, signals in accordance with second generation (2G) transmission protocols, third generation (3G) transmission protocols, fourth generation (4G) transmission protocols, fifth generation (5G) transmission protocols, Bluetooth® transmission protocols, Wi-Fi transmission protocols, or some other wireless transmission protocol either known or subsequently developed. The die 115 of semiconductor package 105 may be the same type of component as the die 115 of semiconductor package 110, or the dies 115 of semiconductor packages 105 and 110 may be a different type of component from one another.

The package substrate 120 may be, for example, a cored or coreless substrate in various embodiments. The package substrate 120 may include one or more layers of a dielectric material such as build-up film or some other material. The package substrate 120 may include one or more conductive elements such as pads, traces, vias, etc. that are designed to carry and electrical signal throughout the package substrate 120. In some embodiments, the package substrate 120 may include an additional component not pictured in FIG. 1 such as an additional die either coupled to or positioned within the package substrate 120.

In embodiments the package substrate 120 of semiconductor packages 105 and 110 may have a cavity 107 within the package substrate 120. The cavity 107 may, for example, be formed in the package substrate 120 either during formation of the package substrate 120 or subsequently to formation of the package substrate 120. The cavity 107 may, for example, be formed by drilling, routing, etching, etc. of the package substrate 120. Alternatively, the package substrate 120 may be formed around a placeholder element that is subsequently removed, leaving behind the cavity 107. As may be seen, the cavity 107 may extend all the way through the package substrate 120.

A waveguide 125 may be positioned within the cavities 107 of semiconductor packages 105 and 110. Such a waveguide may be referred to herein as a "through-package waveguide." The waveguide 125 may be communicatively coupled with the dies 115, and particularly radio frequency (RF) circuitry 130 of the dies. The RF circuitry 130 may be to generate and transmit a high-frequency electromagnetic signal (e.g., a mmWave or THz-frequency signal) into the waveguide 125. The waveguide 125 may allow the high-frequency electromagnetic signal to propagate through the waveguide and allow communication between the dies 115 of semiconductor packages 105 and 110. Notably, it may be seen in FIG. 1 that the waveguide 125 may communicatively couple with a die 115 at a first side of the package substrate 120, and protrude from the opposite side of the package substrate 120.

Generally, the waveguide 125 may include one or more channels. That is, the waveguide 125 may in some embodiments be configured to carry a single electromagnetic signal through a single channel, while in other embodiments the waveguide 125 may include a plurality of channels, and respective ones of the channels may carry a different electromagnetic signal than another of the channels. As used herein, a "channel" may refer to a physical waveguide channel, which may also be referred to as a "lane." Generally, a "channel" or a "lane" may include one or both of a receive link and a transmit link. Generally, a waveguide that includes a plurality of individual waveguides (e.g., individual channels or lanes) may be referred to as a waveguide bundle. A waveguide bundle may include 2 or more waveguides arranged in a one dimensional (1D) array, two-dimensional (2D) array, or some other bundling configuration. In some embodiments, the waveguide may be considered to be a coaxial waveguide, a dielectric waveguide, or a combination of the two. Generally, as used herein a "coaxial" waveguide may refer to a waveguide with a center conductor that is surrounded by dielectric material, and includes a grounded outer shielding. A coaxial waveguide may have a variety of cross-sectional shapes such as rectangular, circular, etc. By contrast, a "dielectric" waveguide may refer to a waveguide that lacks a center conductor and is generally formed of a dielectric material with a variety of cross-sectional shapes such as a rectangular shape, a circular shape, etc. Similarly to the coaxial waveguide, the dielectric waveguide may have an outer metal cladding.

Figure 2:
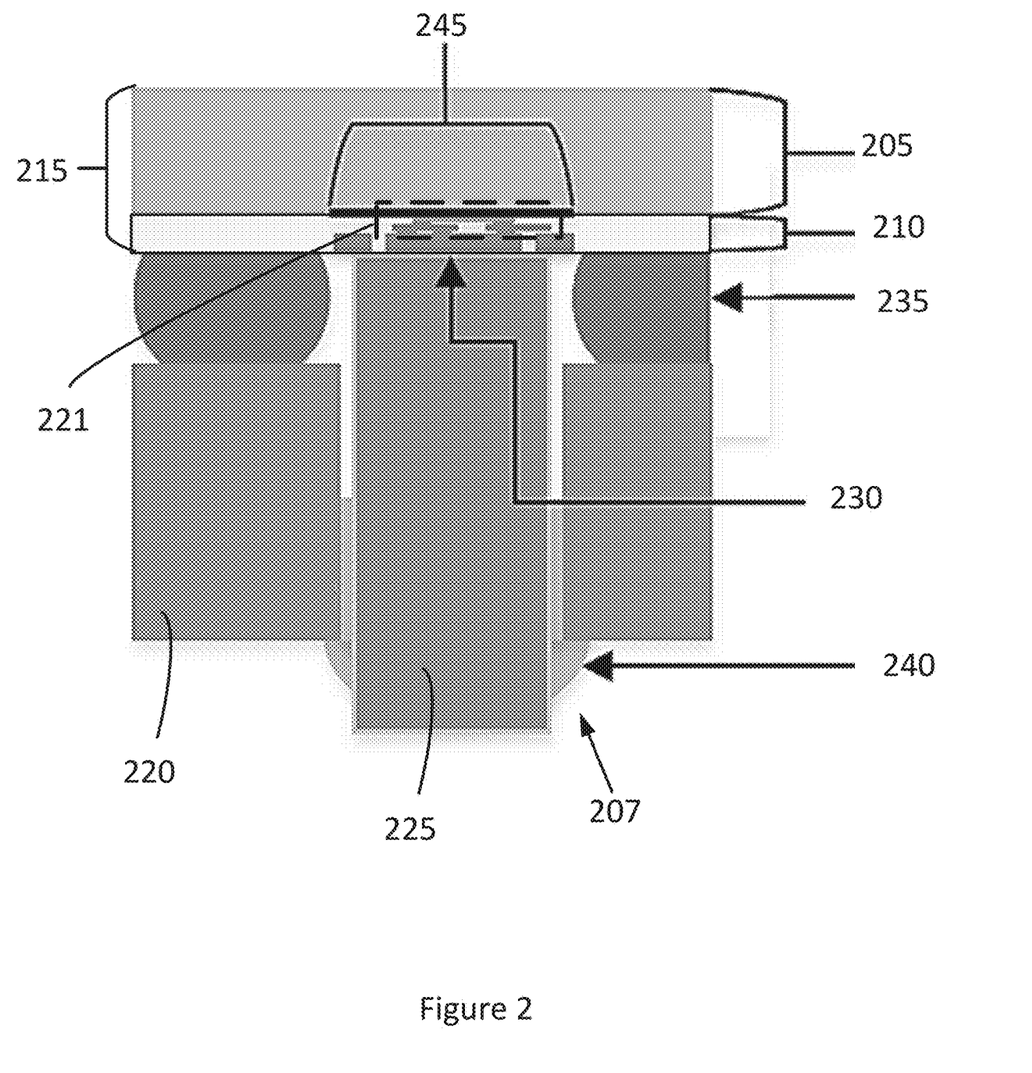
FIG. 2 illustrates a simplified view of a portion of an example package with a through-package waveguide, in accordance with various embodiments.

FIG. 2 illustrates a simplified view of a portion of an example package with a through-package waveguide, in accordance with various embodiments. Specifically, FIG. 2 may depict a more detailed "close-up" view of a semiconductor package coupled with a waveguide than is depicted in FIG. 1.

FIG. 2 depicts a die 215, which may be similar to, and share characteristics of, die 115. The die 215 may be coupled with a package substrate 220, which may be similar to, and share characteristics of, package substrate 120. The die 215 may be coupled with the package substrate 220 by interconnects 235. The interconnects 235 may be, for example, solder bumps as depicted. In some embodiments the interconnects 235 may be considered to be balls of a ball grid array (BGA). In other embodiments, the interconnects 235 may be pins of a pin grid array (PGA), elements of a land grid array (LGA), or some other type of interconnect. For example, as will be discussed later in some embodiments the die 215 may be coupled with the package substrate 220 through some other device such as a mechanical coupling (a socket or a clamp), or some other type of coupling or interconnect. In some embodiments, the interconnects 235 may serve only to physically couple the die 215 to the package substrate 220, while in other embodiments the interconnects 235 may be coupled with pads of the die 215 and package substrate 220 (not shown for the sake of clarity of the Figure) and allow for communication between the die 215 and the package substrate 220.

Generally, the die 215 may include an active portion 205 and an interconnect stack 210. The active portion 205 may include, for example, one or more layers of silicon or some other type of material. The active portion 205 may further include one or more active semiconductor elements such as transistor, diodes, etc. These active semiconductor elements may be in a section of the active portion 205 adjacent the interconnect stack 210. The active portion 205 may further include one or more passive elements such as resistors, capacitors, etc. The active and passive semiconductor elements are not depicted in FIG. 2 for the sake of clarity of the Figure.

The interconnect stack 210 may include one or more interconnects 221 that may serve to interconnect the active or passive semiconductor elements of the active portion 205. The interconnects 221 may be, for example, a metal interconnect formed out of copper, or some other interconnect. Generally, the interconnects 221 may be embedded in one or more layers of a dielectric material such as silicon oxide, carbon doped oxide, or some other dielectric material. The interconnects 221 may be or include, for example, one or more pads, vias, traces, etc. The interconnect stack 210 may also include one or more passive devices such as resistors, capacitors, inductors, etc. As noted above, the interconnects 221 or the passive devices may serve to connect the various active elements of the active portion 205 to form one or more active circuits within the die 215. The active circuits may be digital, analogue, mixed signal etc.

In addition to the above-described elements, the interconnect stack 210 may, in some embodiments, include RF circuitry 230 or portions thereof. The RF circuitry 230 may be configured to receive an electronic signal from an active semiconductor element of the active portion 205 of the die 215. The RF circuitry 230 may convert the electronic signal into an electromagnetic signal such as a high-speed/high-frequency signal as discussed above. The RF circuitry 230 may further include one or more wave launchers or some other type of signal launcher that is configured to transmit the electromagnetic signal from the die 215. The wave/signal launcher may include, for example, one or more metal plates, an antenna, a horn-type launcher, a microstrip-to-slot-transition launcher, or some other type of wave or signal launcher. Additionally or alternatively, the RF circuitry 230 may include circuitry to receive an electromagnetic signal and convert the electromagnetic signal into an electronic signal that may then be transmitted to an element of the active portion 205 of the die 215.

More specifically, the RF circuitry 230 may be configured to send or receive an electromagnetic signal to or from a waveguide 225, which may be similar to, and share characteristics of, waveguide 125. The waveguide 225 may be positioned in a cavity 207 of the package substrate 220, and the cavity 207 may be similar to, and share characteristics of, cavity 107. As discussed above, the waveguide 225 may be held in place within the cavity 207 by an adhesive 240. The adhesive may be, for example, epoxy or some other adhesive. In some embodiments, the waveguide 225 may be positioned within the cavity 207, and then the adhesive 240 may be applied such that it at least partially fills the cavity 207 and holds the waveguide 225 in place. In other embodiments, the adhesive 240 may be applied to the waveguide 225 prior to insertion of the waveguide 225 within the cavity 207. In some embodiments, an adhesive may not be used and instead a soft plug-element made out of a material such as plastic may be positioned on the waveguide 225, and the waveguide 225 may be inserted within the cavity 207. The plug-element may hold the waveguide 225 within the cavity 207 through friction against the sides of the package substrate 220. Generally, it may be desirable for the adhesive 240 to be made of a material that may be removed (e.g., through the application of heat or a solvent) without damaging the die 215, the interconnects 235, or the package substrate 220. In this manner, the waveguide 225 may be replaced if some sort of failure occurs without damaging other elements of the semiconductor package.

As may be seen in FIG. 2, the waveguide 225 may be communicatively coupled with the die 215 within an RF alignment area 245 of the die 215. Generally, because the tolerances for semiconductor package manufacture may be relatively strict (e.g., with tolerances on the order of less than 50 micrometers ("microns")), additional manual alignment of the waveguide 225 to the RF alignment area 245 may not be required.

It will be understood that the above descriptions of various elements of FIGS. 1 and 2 are intended as examples of various embodiments, and other embodiments may be different in one or more respects. For example, the description of the various adhesive elements is intended as one example, and other embodiments may use one or more of the described adhesive elements (e.g., a plug and an adhesive), or some other type of material. Additionally, the illustrations of the various elements are intended as examples, and other embodiments may have a different number of elements than shown in FIG. 1 (e.g., a package substrate may include a plurality of dies attached thereto, a different number of interconnects may be used to couple a die to a package substrate, etc.). Additionally, although the waveguides 125 and 225 are depicted as single elements, in other embodiments the waveguides 125 or 225 may include a plurality of elements or channels. Additionally, although the waveguide 225 is depicted as abutting the die 215, in other embodiments the waveguide 225 may be offset from the die 215. For example, in some embodiments the waveguide 225 may be between approximately 0 microns and approximately 10 microns away from the die 215. Other embodiments may have even more distance between the waveguide 225 and the die 215 based on factors such as the strength of the wave or signal launchers, acceptable loss or power characteristics of the system, design characteristics, etc. Finally, although the waveguide 225 is depicted as being entirely perpendicular to the face of the die 215 or the package substrate 220, in other embodiments the waveguide 225 may not be perpendicular to the face of the die 215 or the package substrate 220 based on factors such as angular misalignment when inserting the waveguide 225 in the package substrate 220, angularity when cutting the end of the waveguide 225, etc.

Figure 3:
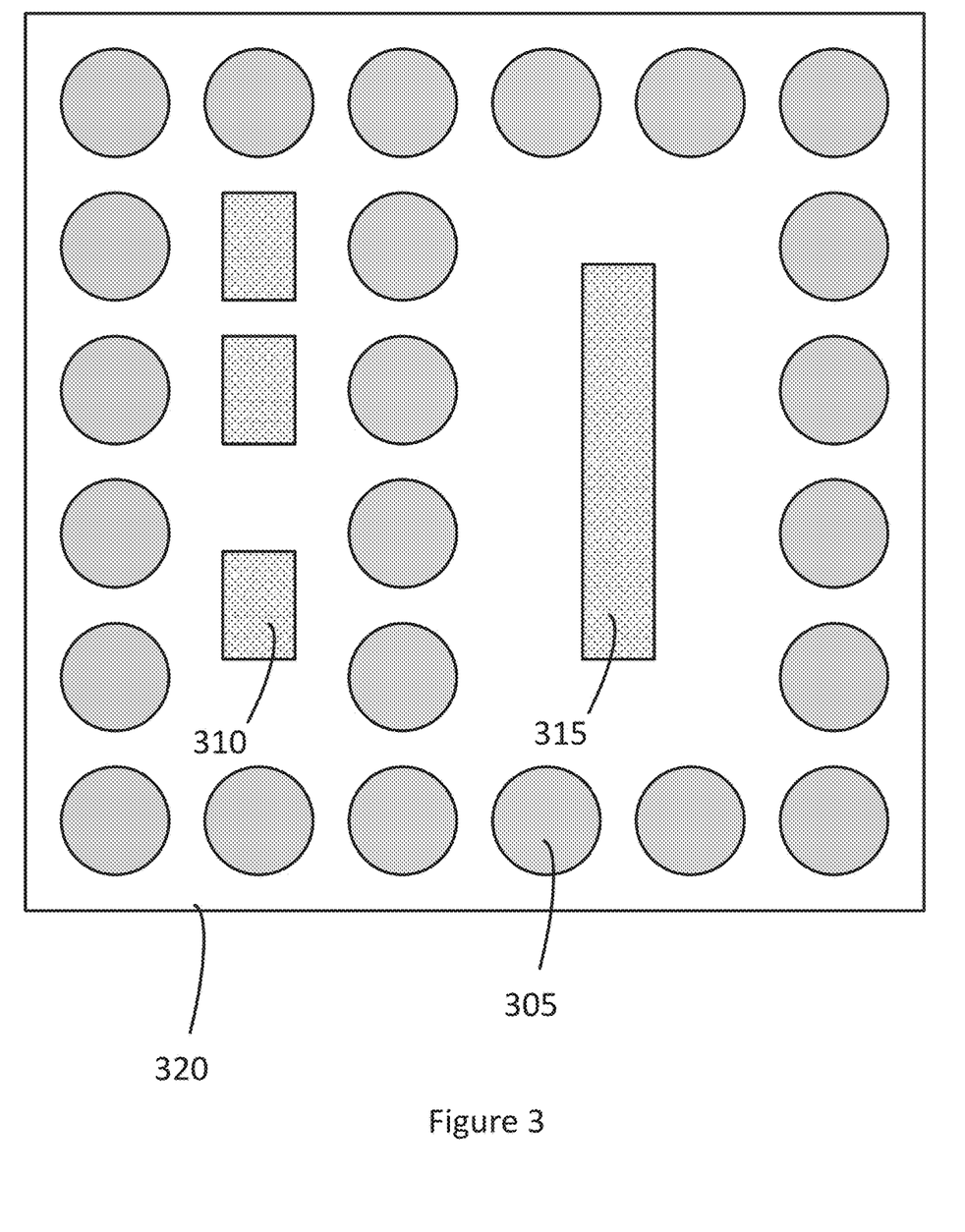
FIG. 3 illustrates a simplified bottom-on view of an example package substrate that is to be used with a through-package waveguide, in accordance with various embodiments.

FIG. 3 illustrates a simplified bottom-on view of an example package substrate that is to be used with a through-package waveguide, in accordance with various embodiments. Specifically, FIG. 3 illustrates a package substrate 320, which may be similar to, and share characteristics of, package substrates 120 and 220. The view of FIG. 3 may be considered to be a view of the package substrate opposite the side to which a die such as die 115 or 215 may be coupled.

The package substrate 320 may include a plurality of interconnects 305. Generally, the interconnects 305 may be to couple the package substrate 320 to a printed circuit board (PCB) of a computing device. Similarly to interconnects 235, the interconnects 305 may be a solder ball or a solder bump. In some embodiments, the interconnects 305 may be elements of a BGA, LGA, or PGA. In other embodiments, the interconnects 305 may not be present and instead the package substrate 320 may be coupled with the PCB by another device such as a socket, a clamp, etc. In some embodiments, the interconnects 305 may serve only to physically couple the die package substrate 320 to the PCB, while in other embodiments the interconnects 305 may be coupled with pads of the package substrate 320 (not shown for the sake of clarity of the Figure) and PCB and allow for communication between the package substrate 320 and the PCB.

The package substrate 320 may also include a plurality of cavities such as cavities 310 and 315. The cavities 310 and 315 may be similar to cavities 107 or 207 in that they may extend through the entirety of the package substrate 320. Generally, the cavities 310 and 315 may have a variety of spacings. For example, in some embodiments the cavities may be relatively small such as cavity 310, and may be configured to accommodate only a single waveguide or a single waveguide channel. In other embodiments, the cavities may be relatively large such as cavity 315, and may be configured to accommodate a plurality of waveguides or a plurality of waveguide channels.

It will be understood that this depiction of a package substrate 320 with a plurality of cavities 310/315 is intended as an example, and other embodiments may have other variations. For example, in some embodiments the package substrate 320 may have more or fewer interconnects 305 or cavities 310/315 than depicted in FIG. 3. In some embodiments, the interconnects 305 or cavities 310/315 may have a different orientation, configuration, or spacing than depicted in FIG. 3. In some embodiments, the package substrate 320 may only have cavities of a single size, rather than the cavities 310 and 315 of different sizes. In some embodiments, the cavities 310/315 may have a different cross-sectional shape than depicted in FIG. 3. For example, in some embodiments the cavities 310/315 may have a circular cross section, a square-shaped cross section, an "H"-shaped cross section, or some other type of cross section. Similarly, a waveguide to be placed in the cavities 310/315 may likewise have a variety of cross-sectional shapes such as circular, square, "H," or be a single- or dual-ridge-waveguide etc.

Figure 4:
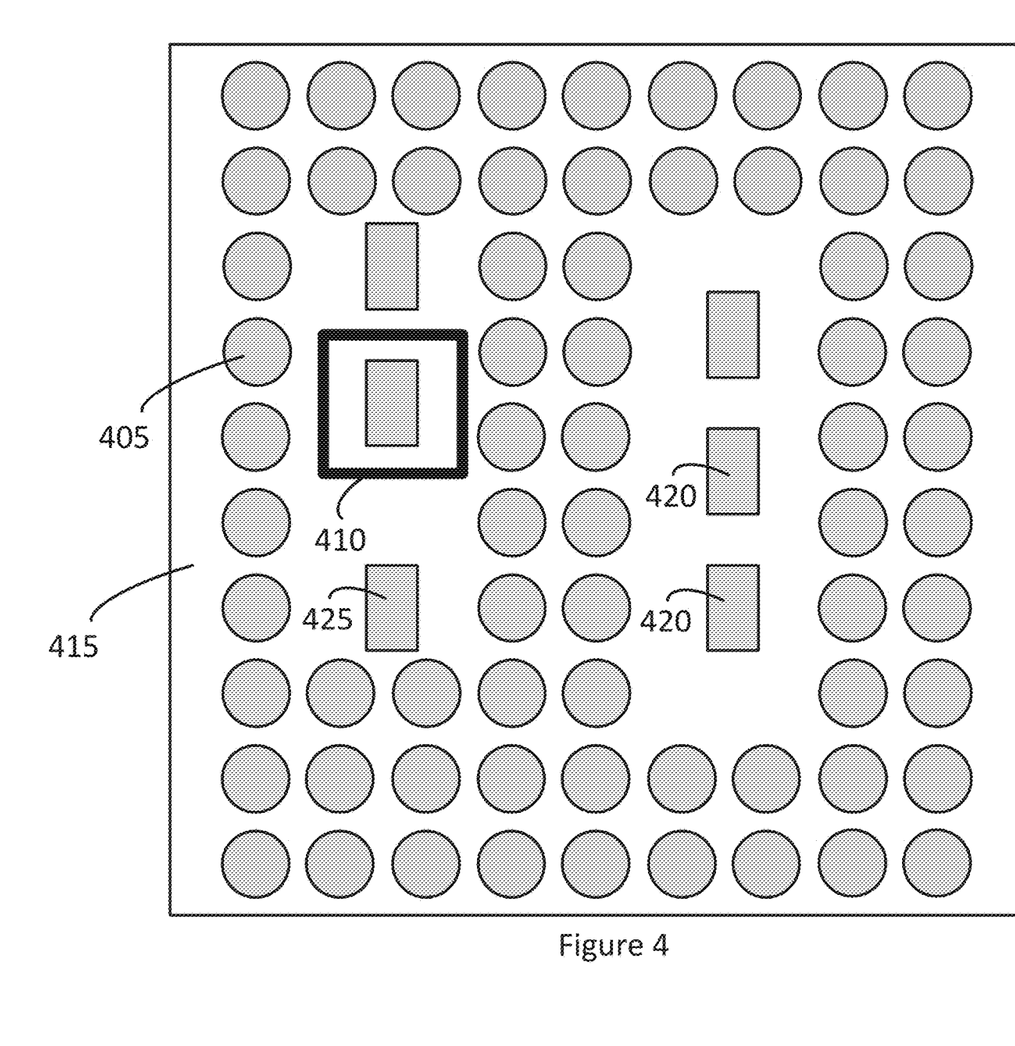
FIG. 4 illustrates a simplified bottom-on view of an example die that is to be used with a through-package waveguide, in accordance with various embodiments.

FIG. 4 illustrates a simplified bottom-on view of an example die 415 that is to be used with a through-package waveguide, in accordance with various embodiments. Specifically, the die 415 may be similar to, and share one or more characteristics of, dies 115 or 215. The view of the die 415 in FIG. 4 may be considered to be a view of the side of the die that is to be coupled with a package substrate such as package substrate 320. The die 415 may include a plurality of interconnects 405 which may be similar to, and share characteristics of, interconnects 235.

It will be noted that FIG. 4 depicts a greater number of interconnects 405 than the number of interconnects 305 depicted in FIG. 3. Additionally, the interconnects 405 appear smaller than the interconnects 305 of FIG. 3. However, in other embodiments the relative sizes of interconnects 305 and 405 may be different than depicted (e.g., they may be the same size, interconnects 405 may be larger, etc.) or the relative numbers of the interconnects 305 and 405 may be different (e.g., there may be more interconnects 305 than interconnects 405).

The die 405 may also include a plurality of signal/wave launchers 420/425. The signal/wave launchers 420/425 may be elements of RF circuitry such as RF circuitry 230 of FIG. 2. Specifically, the signal/wave launchers 420/425 may be configured to transmit or receive a high-speed/high-frequency electromagnetic signal through a waveguide such as waveguides 125 or 225 as described above.

Generally, the signal/wave launchers 420/425 may be configured to align with the cavities 310/315 of package substrate 320 when the die 415 is coupled with the package substrate 320. For example, signal/wave launchers 425 may generally align with the cavities 310, and more particularly with a waveguide positioned within the cavities 310. Similarly, the signal/wave launchers 420 may generally align with the cavity 315 of package substrate 320. As previously noted, the cavity 315 may be configured to accommodate one or more waveguide bundles with one or more channels. The signal/wave launcher 420 may couple with the waveguide bundle in general, and a waveguide channel in particular, or in other embodiments a plurality of waveguides may be inserted in the cavity 315 and a respective waveguide may be coupled with a respective signal/wave launcher 420.

In some embodiments, certain of the cavities such as cavity 425 (or some other cavity) may be surround by a shield element 410. The shield elements 410 may serve to electromagnetically isolate the cavity 425 from some other cavity or interconnect of the die 415, thereby reducing or eliminating undesirable cross-talk between waveguides. Additionally, the shield elements 410 may extend to the package and form a continuous shield of the shape depicted in the Figure. In some embodiments, the shield element 410 may be referred to as a "closed-path" shield element.

Similarly to FIG. 3, it will be understood that the configuration, shape, orientation, and spacing of various elements of FIG. 4 is intended only as an example, and other embodiments may have different configurations/shapes/orientations/spacing. For example, in some embodiments the signal/wave launchers 420 may not be rectangular, but rather may have a different cross-sectional shape as described above.

Figure 5:
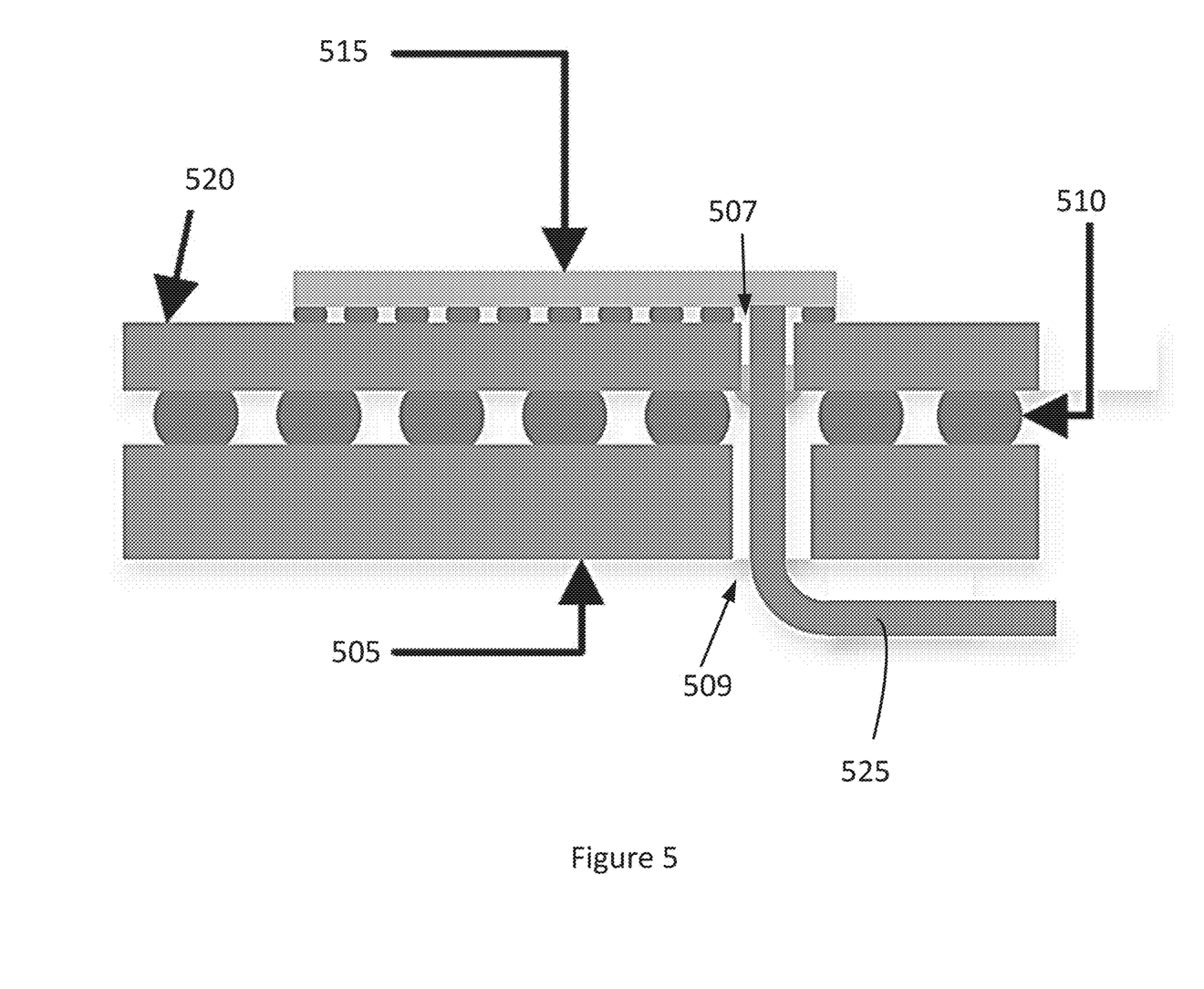
FIG. 5 illustrates a simplified view of a system with a through-package waveguide, in accordance with various embodiments.
Figure 6:
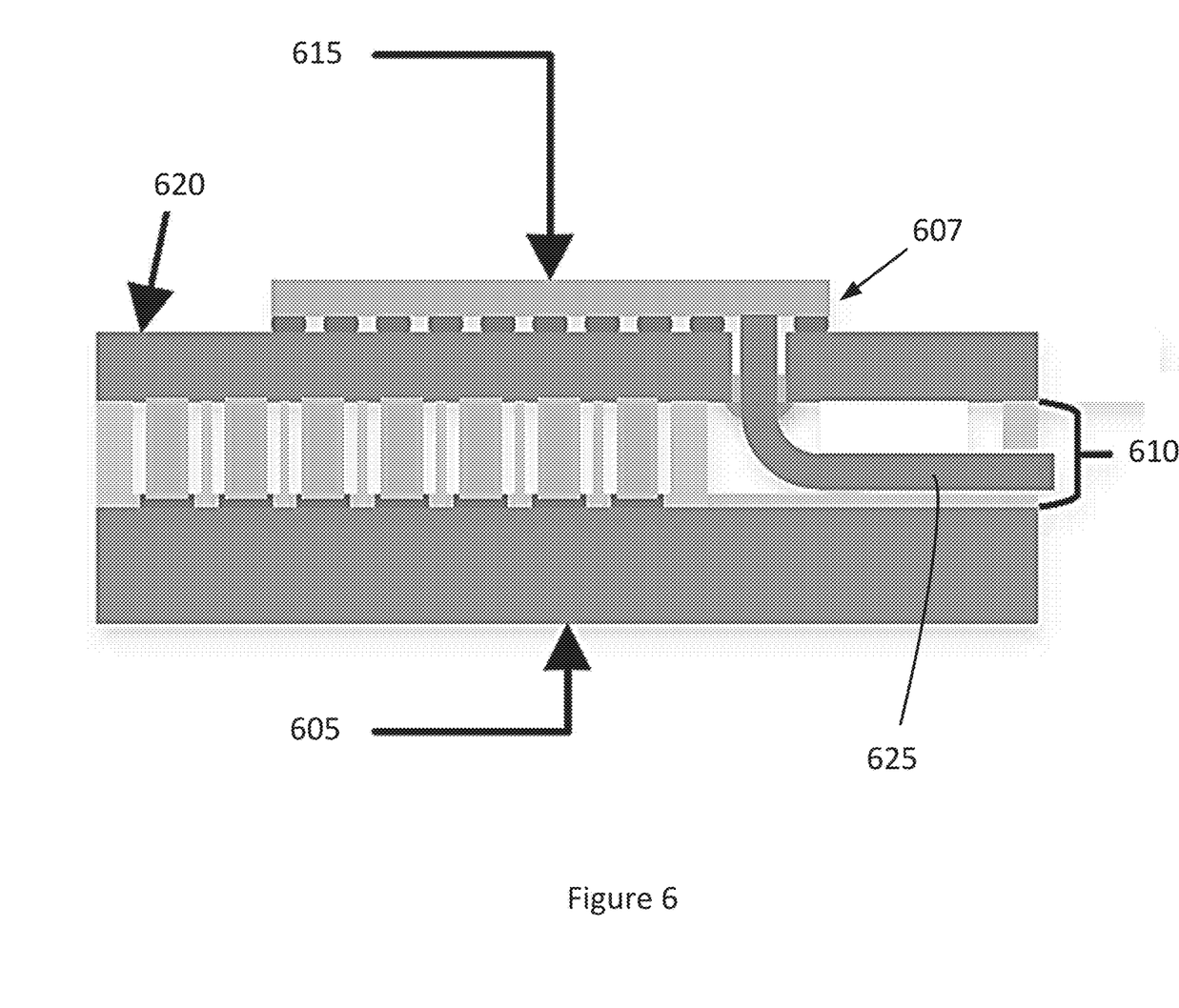
FIG. 6 illustrates an alternative simplified view of a system with a through-package waveguide, in accordance with various embodiments.
Figure 7:
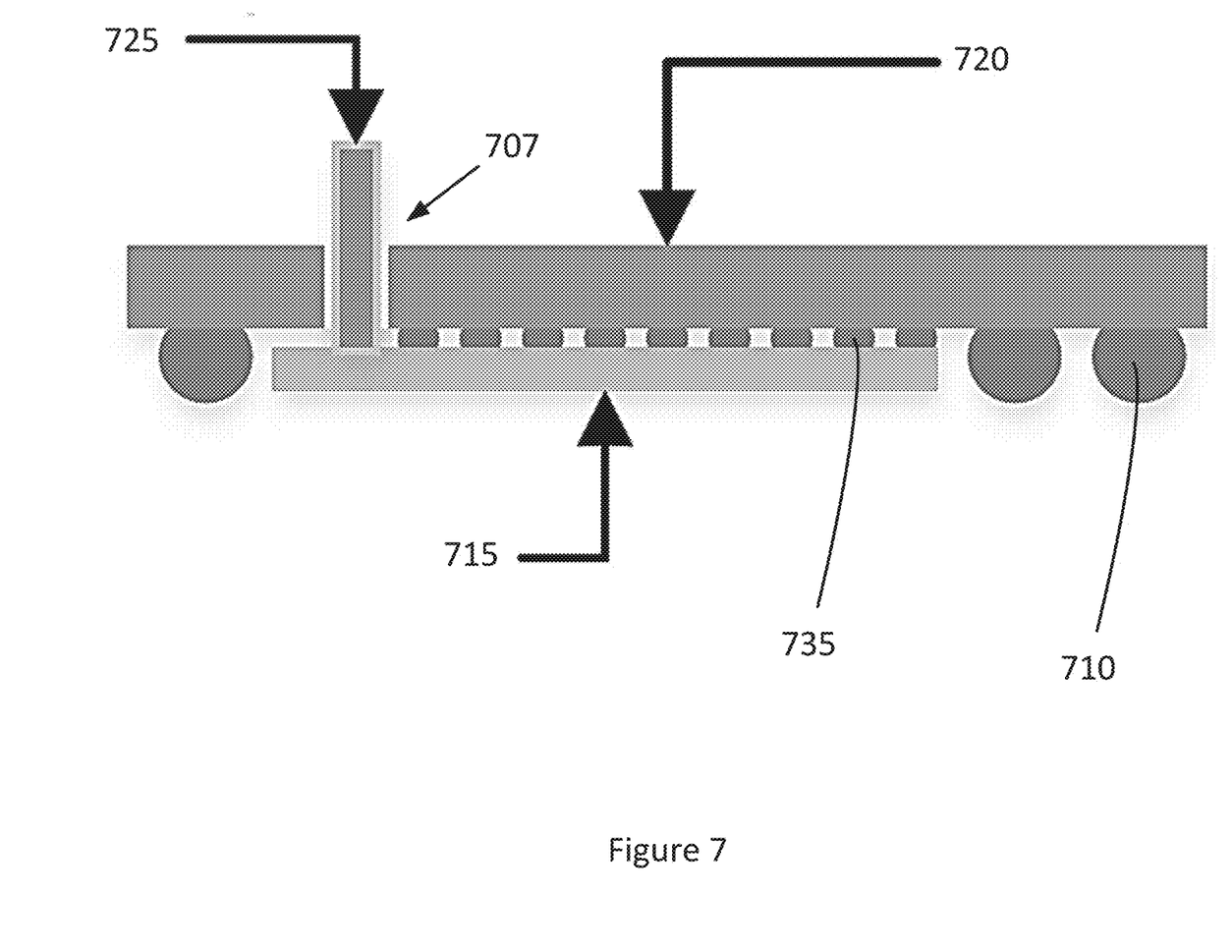
FIG. 7 illustrates an alternative simplified view of a system with a through-package waveguide, in accordance with various embodiments.

FIG. 5-7 illustrate a variety of alternative simplified views of a system with a through-package waveguide, in accordance with various embodiments. Generally, FIGS. 5-7 may be considered to have elements similar to those depicted in, and discussed with respect to, various Figures above. Each and every element of FIGS. 5-7 will not be specifically enumerated or discussed for the sake of brevity and lack of redundancy, but it may be assumed that elements that share similarities between the Figures may have similar characteristics to those discussed above with respect to the various previous Figures.

The system of FIG. 5 may include a die 515, which may be similar to, and share characteristics of, dies 115, 215, etc. The system of FIG. 5 may further include a package substrate 520, which may be similar to, and share characteristics of, package substrates 120, 220, etc. The package substrate 520 may in turn be coupled with a PCB 505 by one or more interconnects 510 which may be similar to, and which may share characteristics of, interconnects 305.

The PCB 505 may be, for example, a mother board of a computing device or some other type of PCB. More generally, the PCB 505 may be coupled with a plurality of semiconductor packages or other computing components. Similarly to the package substrate 120, the PCB 505 may include one or more organic or inorganic dielectric layers, and may be cored or coreless. The PCB 505 may further include one or more conductive elements such as traces, vias, pads, etc. positioned within or on the periphery of the PCB 505.

As can be seen in FIG. 5, in addition to the package substrate 520 having a cavity 507 (which may be similar to, and which may share characteristics of, cavities 107, 207, etc.), the PCB 505 may also have a cavity 509. Similarly to as describe with respect to cavity 107, the cavity 509 may be formed at the time of manufacture of the PCB 505, or may be later formed through a technique such as drilling, etching, etc. A waveguide 525, which may be similar to waveguides 125, 225, etc. may be communicatively coupled with the die 515 and positioned within cavities 507 and 509, as depicted in FIG. 5. Although not explicitly shown, an adhesive such as adhesive 240 may be positioned in one or both of cavities 507 and 509 to secure the waveguide 525 within the cavities 507/509.

The system of FIG. 6 may include elements similar to those of FIG. 5. Specifically, FIG. 6 may depict a die 615, a package substrate 620, and a PCB 605, which may be respectively similar to, and share characteristics of, die 115/215/etc., package substrate 120/220/etc., and PCB 505.

However, rather than being coupled to the PCB 605 by interconnects such as interconnects 510, the package substrate 620 may be coupled with the PCB 605 by a socket 610, as discussed above. More particularly, the socket 610 may be adhered or otherwise coupled to the PCB 605 on one side, and configured to receive and securely hold the package substrate 620 on the other side of the socket 610 (or vice-versa). Similarly to the various interconnects described above, in some embodiments the socket 610 may only physically coupled the package substrate 620 to the PCB 605, while in other embodiments the socket 610 may allow for electrical communication between the package substrate 620 and the PCB 605.

As can be seen in FIG. 6, the die 615 may be communicatively coupled with a waveguide 625, which may be similar to waveguides 125/225/etc. The waveguide 625 may be positioned in a cavity 607 in the package substrate 620, which may be similar to cavities 107/207/etc. As may be seen, the waveguide 625 may protrude from the package substrate 620 at a side of the package substrate 620 opposite the side to which the die 615 is coupled, and the waveguide 625 may be threaded through the socket 610 between the PCB 605 and the package substrate 620. In some embodiments, the socket 610 may be specially designed to accommodate the waveguide 625, while in other embodiments the waveguide 625 may be threaded through existing spaces of the socket 610.

The system of FIG. 7 may include elements similar to those of FIGS. 5 and 6. Specifically, FIG. 7 may depict a die 715, a package substrate 720, and a waveguide 725, which may be respectively similar to, and share characteristics of, dies 125/225/etc., package substrate 120/220/etc., and waveguide 125/225/etc. The package substrate 720 may include interconnects 710 which may be similar to, and share characteristics of, interconnects 305. The die 715 may be coupled with the package substrate 720 by interconnects 735 which may be similar to, and share characteristics of, interconnects 235/405/etc.

In the system of FIG. 7, the die 715 may be in a flipped configuration where the die 715 is coupled with a same side of the package substrate 720 as the side to which the interconnects 710 are coupled. In this embodiment, the waveguide 725 may still be positioned in a cavity 707 (which may be similar to, and share characteristics of, cavities 107/207/etc.) and protrude from a side of the package substrate 720 opposite the side to which the die 715 is coupled.

It will be understood that, similarly to other Figures depicted herein, FIGS. 5-7 are intended as example Figures showing variations that may be present in various embodiments. Other embodiments may have more or fewer elements than depicted, elements of different dimensions, combinations of elements from various Figures, etc.

Figure 8:
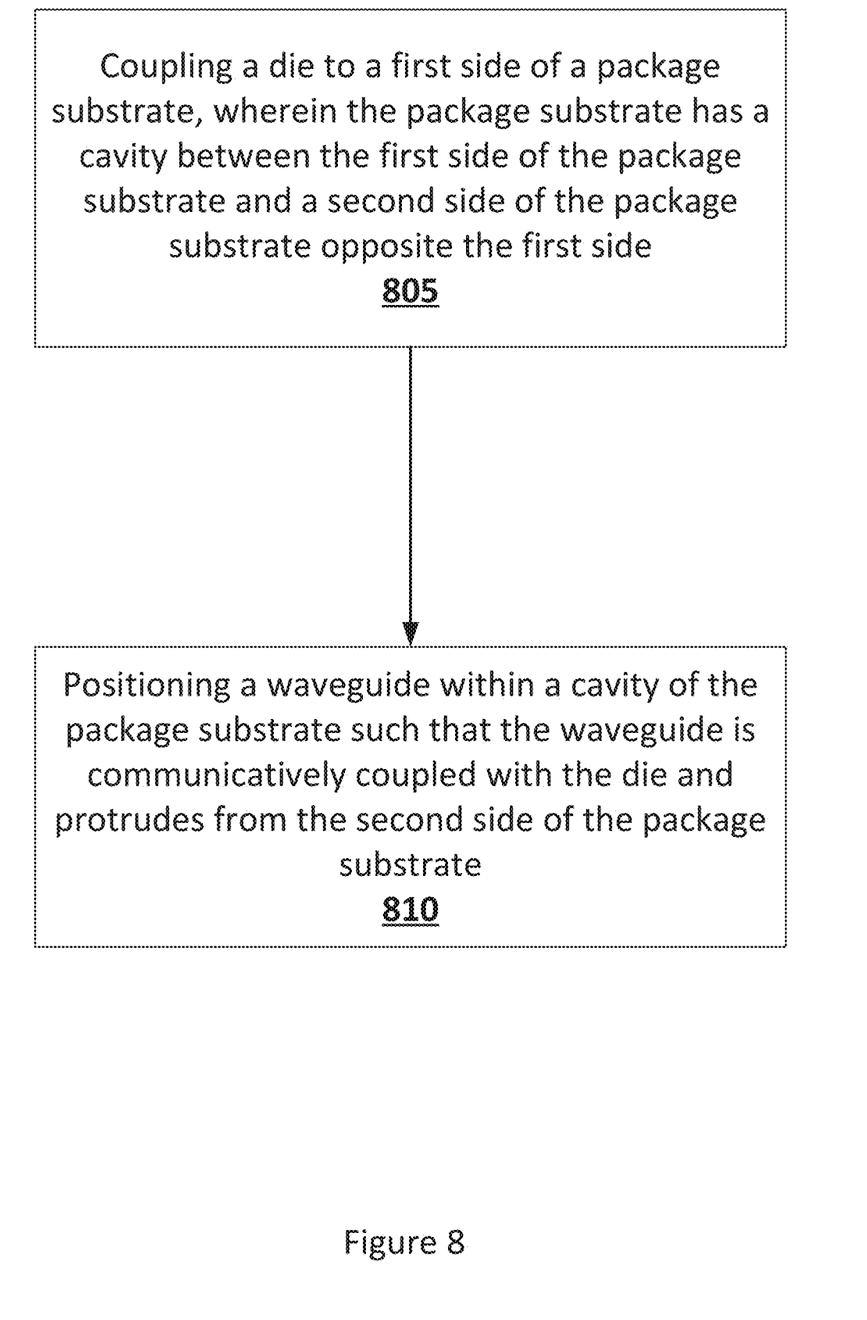
FIG. 8 illustrates a simplified example technique for manufacturing a semiconductor package with a through-package waveguide, in accordance with various embodiments.

FIG. 8 illustrates a simplified example technique for manufacturing a semiconductor package with a through-package waveguide, in accordance with various embodiments. FIG. 8 may be described with respect to the embodiment of FIG. 2, however it will be understood that aspects of FIG. 8 may be applied, in whole or in part, to other embodiments discussed herein, or other embodiments that may include a through-package waveguide.

The technique may include coupling, at 805, a die to a first side of a package substrate. The die may be similar to, for example, die 215, and the package substrate may be similar to, for example, package substrate 220. The package substrate may have a cavity such as, for example, cavity 207. The cavity may be between the first side of the package substrate and a second side of the package substrate opposite the first side.

The technique may further include positioning, at 810, a waveguide within the cavity of the package substrate. The waveguide may be similar to, for example, waveguide 225. The waveguide may be communicatively coupled with the die and protrude from the second side of the package substrate.

It will be understood that the above description is one example technique, and other embodiments may use different techniques with additional or alternative elements. In some embodiments, certain elements may be performed in a different order than depicted in FIG. 8. For example, element 810 may occur prior to, or concurrently with, the occurrence of element 805.

Figure 9:
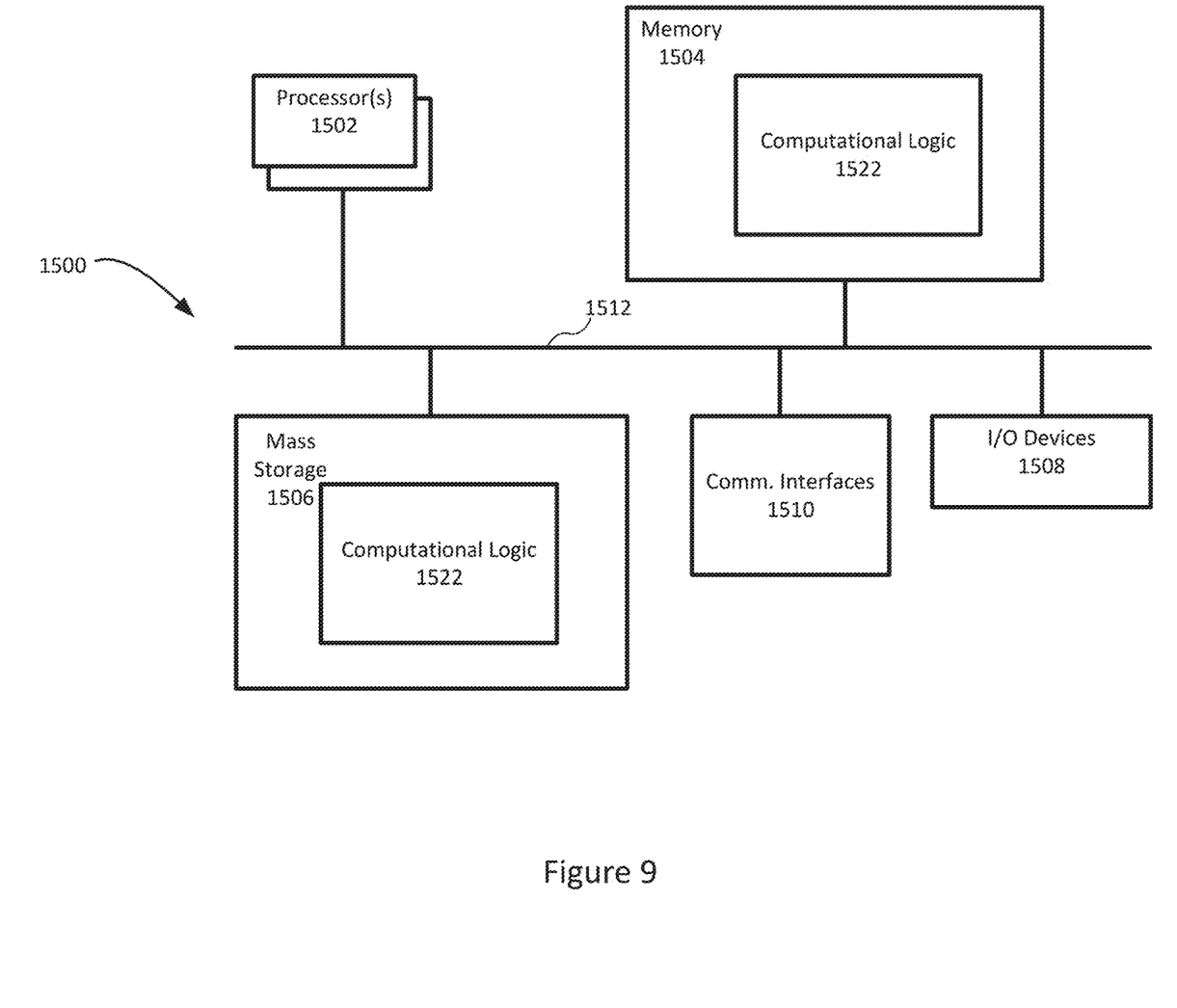
FIG. 9 illustrates an example device that may use various embodiments herein, in accordance with various embodiments.

FIG. 9 illustrates an example computing device 1500 suitable for use with systems 100 or some other depicted system, in accordance with various embodiments. Specifically, in some embodiments, the computing device 1500 may include one or more of systems therein.

As shown, computing device 1500 may include one or more processors or processor cores 1502 and system memory 1504. For the purpose of this application, including the claims, the terms "processor" and "processor cores" may be considered synonymous, unless the context clearly requires otherwise. The processor 1502 may include any type of processors, such as a CPU, a microprocessor, and the like. The processor 1502 may be implemented as an integrated circuit having multi-cores, e.g., a multi-core microprocessor. The computing device 1500 may include mass storage devices 1506 (such as diskette, hard drive, volatile memory (e.g., DRAM, compact disc read-only memory (CD-ROM), digital versatile disk (DVD), and so forth)). In general, system memory 1504 and/or mass storage devices 1506 may be temporal and/or persistent storage of any type, including, but not limited to, volatile and non-volatile memory, optical, magnetic, and/or solid state mass storage, and so forth. Volatile memory may include, but is not limited to, static and/or DRAM. Non-volatile memory may include, but is not limited to, electrically erasable programmable read-only memory, phase change memory, resistive memory, and so forth. In some embodiments, one or both of the system memory 1504 or the mass storage device 1506 may include computational logic 1522, which may be configured to implement or perform, in whole or in part, one or more instructions that may be stored in the system memory 1504 or the mass storage device 1506. In other embodiments, the computational logic 1522 may be configured to perform a memory-related command such as a read or write command on the system memory 1504 or the mass storage device 1506.

The computing device 1500 may further include input/output (I/O) devices 1508 (such as a display (e.g., a touchscreen display), keyboard, cursor control, remote control, gaming controller, image capture device, and so forth) and communication interfaces 1510 (such as network interface cards, modems, infrared receivers, radio receivers (e.g., Bluetooth), and so forth).

The communication interfaces 1510 may include communication chips (not shown) that may be configured to operate the device 1500 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 1510 may operate in accordance with other wireless protocols in other embodiments.

The computing device 1500 may further include or be coupled with a power supply. The power supply may, for example, be a power supply that is internal to the computing device 1500 such as a battery. In other embodiments the power supply may be external to the computing device 1500. For example, the power supply may be an electrical source such as an electrical outlet, an external battery, or some other type of power supply. The power supply may be, for example alternating current (AC), direct current (DC) or some other type of power supply. The power supply may in some embodiments include one or more additional components such as an AC to DC convertor, one or more downconverters, one or more upconverters, transistors, resistors, capacitors, etc. that may be used, for example, to tune or alter the current or voltage of the power supply from one level to another level. In some embodiments the power supply may be configured to provide power to the computing device 1500 or one or more discrete components of the computing device 1500 such as the processor(s) 1502, mass storage 1506, I/O devices 1508, etc.

The above-described computing device 1500 elements may be coupled to each other via system bus 1512, which may represent one or more buses. In the case of multiple buses, they may be bridged by one or more bus bridges (not shown). Each of these elements may perform its conventional functions known in the art. The various elements may be implemented by assembler instructions supported by processor(s) 1502 or high-level languages that may be compiled into such instructions.

The permanent copy of the programming instructions may be placed into mass storage devices 1506 in the factory, or in the field, through, for example, a distribution medium (not shown), such as a compact disc (CD), or through communication interface 1510 (from a distribution server (not shown)). That is, one or more distribution media having an implementation of the agent program may be employed to distribute the agent and to program various computing devices.

The number, capability, and/or capacity of the elements 1508, 1510, 1512 may vary, depending on whether computing device 1500 is used as a stationary computing device, such as a set-top box or desktop computer, or a mobile computing device, such as a tablet computing device, laptop computer, game console, or smartphone. Their constitutions are otherwise known, and accordingly will not be further described.

In various implementations, the computing device 1500 may comprise one or more components of a data center, a laptop, a netbook, a notebook, an ultrabook, a smartphone, a tablet, a personal digital assistant (PDA), an ultra mobile PC, a mobile phone, or a digital camera. In further implementations, the computing device 1500 may be any other electronic device that processes data.

In some embodiments, as noted above, computing device 1500 may include one or more of the systems described herein. For example, in some embodiments the processor 1502, memory 1504, or some other component of the computing device 1500 may be a die such as dies 115, 515, 615, etc.

Examples of Various Embodiments

Example 1 includes a semiconductor package comprising: a die; a package substrate, wherein the die is coupled with the package substrate by one or more interconnects, and wherein the package substrate includes one or more cavities that go through the package substrate from a first side of the package substrate that faces the die to a second side of the package substrate opposite the first side; and a waveguide communicatively coupled with the die, wherein the waveguide extends through one of the one or more cavities such that the waveguide protrudes from the second side of the package substrate.

Example 2 includes the semiconductor package of example 1, wherein the one or more interconnects are solder bumps of a ball grid array (BGA).

Example 3 includes the semiconductor package of example 1, further comprising a closed-path first layer interconnect (FLI) coupled with the first side of the package substrate, wherein the closed-path FLI generally surrounds the waveguide in a plane parallel to the first side of the package substrate.

Example 4 includes the semiconductor package of any of examples 1-3, wherein the waveguide is separated from the die by less than 10 micrometers ("microns").

Example 5 includes the semiconductor package of any of examples 1-3, wherein the waveguide includes a plurality of waveguides that form a waveguide bundle.

Example 6 includes the semiconductor package of any of examples 1-3, wherein the waveguide is to support propagation of an electromagnetic signal to or from the die.

Example 7 includes the semiconductor package of any of examples 1-3, wherein the die includes one or more wave launchers that are to generate an electromagnetic signal and transmit the electromagnetic signal to the waveguide.

Example 8 includes an electronic device comprising: a printed circuit board (PCB); and a semiconductor package coupled with the PCB, wherein the semiconductor package includes: a die coupled with a first side of a package substrate, wherein the package substrate includes one or more cavities that go from the first side of the package substrate to a second side of the package substrate opposite the first side; and a waveguide positioned within one of the one or more cavities, wherein the waveguide is communicatively coupled with the die and protrudes from the second side of the package substrate.

Example 9 includes the electronic device of example 8, wherein the semiconductor package is coupled with the PCB by a socket.

Example 10 includes the electronic device of example 8, wherein the semiconductor package is coupled with the PCB by one or more interconnects.

Example 11 includes the electronic device of any of examples 8-10, wherein the waveguide protrudes from the second side of the package substrate and is routed between the PCB and the semiconductor package in a direction parallel to the second side of the package substrate.

Example 12 includes the electronic device of any of examples 8-10, wherein the PCB includes one or more cavities from a first side of the PCB that faces the semiconductor package and a second side opposite the first side, and wherein the waveguide is positioned within one of the one or more cavities of the PCB, and the waveguide protrudes from the second side of the PCB.

Example 13 includes the electronic device of any of examples 8-10, wherein the die is a first die, and further comprising a second die coupled with the PCB, wherein the waveguide includes a first end communicatively coupled with the first die and a second end opposite the first end, wherein the second end is communicatively coupled with the second die.

Example 14 includes a method of manufacturing a semiconductor package with a waveguide, wherein the method includes: coupling a die to a first side of a package substrate, wherein the package substrate has a cavity between the first side of the package substrate and a second side of the package substrate opposite the first side; and positioning a waveguide within the cavity such that the waveguide is communicatively coupled with the die and protrudes from the second side of the package substrate.

Example 15 includes the method of example 14, wherein positioning the waveguide within the cavity includes positioning the waveguide at least one micrometer away from the die.

Example 16 includes the method of examples 14 or 15, further comprising adhering the waveguide to the package substrate within the cavity with an adherent material.

Example 17 includes the method of example 16, wherein the adherent material is epoxy, an adhesive, or a friction-based plug.

Example 18 includes the method of example 16, wherein adhering the waveguide to the package substrate includes removably adhering the waveguide to the package substrate.

Example 19 includes the method of example 16, wherein adhering the waveguide to the package substrate includes placing the adherent on the waveguide prior to positioning the waveguide within the cavity.

Example 20 includes the method of example 16, wherein adhering the waveguide to the package substrate includes placing the adherent material within the cavity after the waveguide is positioned within the cavity.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. A semiconductor package comprising:
a die;
a package substrate, wherein the die is coupled with the package substrate by one or more interconnects, and wherein the package substrate includes one or more cavities that go through the package substrate from a first side of the package substrate that faces the die to a second side of the package substrate opposite the first side; and
a waveguide communicatively coupled with the die, wherein the waveguide extends through one of the one or more cavities such that the waveguide protrudes from the second side of the package substrate.

2. The semiconductor package of claim 1, wherein the one or more interconnects are solder bumps of a ball grid array (BGA).

3. The semiconductor package of claim 1, further comprising a closed-path first layer interconnect (FLI) coupled with the first side of the package substrate, wherein the closed-path FLI generally surrounds the waveguide in a plane parallel to the first side of the package substrate.

4. The semiconductor package of claim 1, wherein the waveguide is separated from the die by less than 10 micrometers.

5. The semiconductor package of claim 1, wherein the waveguide includes a plurality of waveguides that form a waveguide bundle.

6. The semiconductor package of claim 1, wherein the waveguide is to support propagation of an electromagnetic signal to or from the die.

7. The semiconductor package of claim 1, wherein the die includes one or more wave launchers that are to generate an electromagnetic signal and transmit the electromagnetic signal to the waveguide.

8. An electronic device comprising:
a printed circuit board (PCB); and
a semiconductor package coupled with the PCB, wherein the semiconductor package includes:
a die coupled with a first side of a package substrate, wherein the package substrate includes one or more cavities that go from the first side of the package substrate to a second side of the package substrate opposite the first side; and a waveguide positioned within one of the one or more cavities, wherein the waveguide is communicatively coupled with the die and protrudes from the second side of the package substrate.

9. The electronic device of claim 8, wherein the semiconductor package is coupled with the PCB by a socket.

10. The electronic device of claim 8, wherein the semiconductor package is coupled with the PCB by one or more interconnects.

11. The electronic device of claim 8, wherein the waveguide protrudes from the second side of the package substrate and is routed between the PCB and the semiconductor package in a direction parallel to the second side of the package substrate.

12. The electronic device of claim 8, wherein the PCB includes one or more cavities from a first side of the PCB that faces the semiconductor package and a second side opposite the first side, and wherein the waveguide is positioned within one of the one or more cavities of the PCB, and the waveguide protrudes from the second side of the PCB.

13. The electronic device of claim 8, wherein the die is a first die, and further comprising a second die coupled with the PCB, wherein the waveguide includes a first end communicatively coupled with the first die and a second end opposite the first end, wherein the second end is communicatively coupled with the second die.

14. A method of manufacturing a semiconductor package with a waveguide, wherein the method includes:

coupling a die to a first side of a package substrate, wherein the package substrate has a cavity between the first side of the package substrate and a second side of the package substrate opposite the first side; and positioning a waveguide within the cavity such that the waveguide is communicatively coupled with the die and protrudes from the second side of the package substrate.

15. The method of claim 14, wherein positioning the waveguide within the cavity includes positioning the waveguide at least one micrometer away from the die.

16. The method of claim 14 further comprising adhering the waveguide to the package substrate within the cavity with an adherent material.

17. The method of claim 16, wherein the adherent material is epoxy, an adhesive, or a friction-based plug.

18. The method of claim 16, wherein adhering the waveguide to the package substrate includes removably adhering the waveguide to the package substrate.

19. The method of claim 16, wherein adhering the waveguide to the package substrate includes placing the adherent on the waveguide prior to positioning the waveguide within the cavity.

20. The method of claim 16, wherein adhering the waveguide to the package substrate includes placing the adherent material within the cavity after the waveguide is positioned within the cavity.

\* \* \* \* \*